United States Patent
Takezawa et al.

(10) Patent No.: US 8,091,505 B2
(45) Date of Patent: Jan. 10, 2012

(54) SECONDARY BATTERY, METHOD AND DEVICE FOR TESTING THE NEGATIVE ELECTRODE, AND METHOD AND DEVICE FOR PRODUCING NEGATIVE ELECTRODE THEREOF

(75) Inventors: Hideharu Takezawa, Osaka (JP); Shinya Fujimura, Osaka (JP); Sadayuki Okazaki, Osaka (JP); Kazuyoshi Honda, Osaka (JP)

(73) Assignee: Panasonic Corporation, Osaka (JP)

( * ) Notice: Subject to any disclaimer, the term of this patent is extended or adjusted under 35 U.S.C. 154(b) by 959 days.

(21) Appl. No.: 12/024,708

(22) Filed: Feb. 1, 2008

(65) Prior Publication Data

US 2008/0187833 A1  Aug. 7, 2008

(30) Foreign Application Priority Data

Feb. 1, 2007  (JP) ................ 2007-022694

(51) Int. Cl.
| | |
|---|---|
| B05C 11/00 | (2006.01) |
| H01M 4/02 | (2006.01) |
| H01M 4/13 | (2006.01) |
| C23C 16/00 | (2006.01) |
| C23C 16/52 | (2006.01) |
| C23C 14/54 | (2006.01) |
| G01B 11/26 | (2006.01) |
| G01C 1/00 | (2006.01) |

(52) U.S. Cl. ............... 118/708; 429/209; 427/8; 427/10; 118/712; 118/726; 356/138

(58) Field of Classification Search ............... 429/209
See application file for complete search history.

(56) References Cited

U.S. PATENT DOCUMENTS

| 6,650,423 B1 * | 11/2003 | Markle et al. ............. 356/601 |
| 2006/0099507 A1 * | 5/2006 | Kogetsu et al. ............ 429/218.1 |
| 2007/0031733 A1 * | 2/2007 | Kogetsu et al. ............ 429/245 |

FOREIGN PATENT DOCUMENTS

| JP | 05-273042 | 10/1993 |
| JP | 2002-083594 | 3/2002 |
| JP | 2003017039 A * | 1/2003 |
| JP | 2005-196970 | 7/2005 |
| JP | 2006-030203 | 2/2006 |

OTHER PUBLICATIONS

Domoto et al., Machine translation of JP 2003017039 A, Jan. 2003.*
Oishi et al., Machine translation of JP 2005196970 A, Jul. 2005.*

\* cited by examiner

*Primary Examiner* — Basia Ridley
*Assistant Examiner* — Sean P Cullen
(74) *Attorney, Agent, or Firm* — McDermott Will & Emery LLP (57) ABSTRACT

In a method for testing a negative electrode of a secondary battery, light is irradiate to an active material layer formed on a current collector having a plurality of projections at least on one side thereof, the active material layer including first columnar bodies of active material grown obliquely from the projections. The angle is measured between the reflected light from the active material layer and a normal line parallel to the thickness direction of the current collector.

2 Claims, 10 Drawing Sheets

SECONDARY BATTERY, METHOD AND DEVICE FOR TESTING THE NEGATIVE ELECTRODE, AND METHOD AND DEVICE FOR PRODUCING NEGATIVE ELECTRODE THEREOF

BACKGROUND OF THE INVENTION

1. Field of the Invention

The present invention relates to a method and device for producing a negative electrode of a secondary battery, and a secondary battery using the negative electrode. More particularly, the present invention relates to a method and device for producing a negative electrode of a non-aqueous electrolyte secondary battery. The negative electrode has an active material with large capacity density such as silicon (Si) or Si compounds, and also relates to a method and device for testing the negative electrode.

2. Background Art

Non-aqueous electrolyte secondary batteries such as lithium ion secondary batteries are attracting attention as large-capacity power supplies particularly for portable devices. In recent years, to further enhance the capacity of such batteries, there have been increasing efforts to develop electrode materials (for example, utilizing active materials having large capacity density and reducing additional materials) or to improve structural parts (for example, reducing thickness).

As part of such efforts, it has been tried to make better use of negative electrode active materials containing Si or a Si compound because of their large capacity density and much larger theoretical capacity than graphite. Such a negative electrode active material with large capacity density, however, prevents the battery from having satisfactory charge-discharge cycle characteristics (hereinafter, cycle characteristics) due to the reasons described below. A negative electrode active material with large capacity density generally expands and contracts when the battery is charged and discharged. Therefore, when a negative electrode includes an active material layer formed on a current collector by kneading particulate active material having large capacity density with a conductive agent and a binder, the following may occur. The expansion and contraction of the large capacity density material may destroy the conductive network either in the active material layer or between the active material layer and the current collector. Or, the expansion may induce a compressive stress which causes the active material particles to be broken into fine particles. As a result, there is a decrease in conductivity between the active material particles.

In attempts to overcome the problem of insufficient cycle characteristics, Japanese Patent Unexamined Publication No. 2002-83594 suggests a non-aqueous electrolyte secondary battery using a negative electrode in which Si is sputtered to form a thin film on a current collector such as a copper foil. The active material thin film formed on the current collector is divided into columnar sections by cuts extending in its thickness direction. The columnar sections are spaced with gaps which serve to reduce the stress caused by the expansion and contraction of the active material during charge and discharge. Japanese Patent Unexamined Publication No. 2005-196970, on the other hand, suggests a non-aqueous electrolyte secondary battery using a negative electrode in which a Si-containing active material is formed in the form of inclined columns on a current collector by a gas-phase process. The active material formed in the form of inclined columns on the current collector disperses the stress caused by its expansion into two directions, parallel and vertical to the main surface of the current collector.

When the active material formed on the current collector is a large capacity density material greatly expanding and contracting during charge and discharge, it is necessary to create appropriate gaps between the block-like particles of the active material. However, in the former patent document, the gaps are created by cuts which are formed in the thickness direction of the active material thin film as a result that the film expands and contracts during charge and discharge. Therefore, it is difficult to control the size of the gaps. The latter patent document, on the other hand, does not refer to controlling the gaps between the block-like particles of the active material.

SUMMARY OF THE INVENTION

An object of the present invention is to provide a secondary battery having large energy density and excellent cycle characteristics; a method and device for producing a negative electrode of the secondary battery; and a method and device for testing a negative electrode of the secondary battery. This object is achieved by managing the gaps between columnar bodies which are active material blocks formed when a negative electrode active material having large capacity density is formed in the form of blocks (columns) on a current collector. The test method of the present invention is carried out as follows. First, light is irradiated to an active material layer formed on a current collector having a plurality of projections at least on one side thereof. The active material layer includes first columnar bodies of the active material grown obliquely from the projections. Then, the angle is measured between the reflected light from the active material layer and a normal line parallel to the thickness direction of the current collector. This test method can manage the angle of growth of the first columnar bodies of the active material. The production method of the present invention uses the measured angle to control the angle of growth of the first columnar bodies.

In the methods, when a negative electrode active material having large capacity density is formed in the form of columns on the current collector, it is possible to manage the angle of growth of the columnar bodies of the active material, thereby managing the size of the gaps between the columnar bodies. This ensures stable production of a negative electrode with excellent cycle characteristics for a secondary battery, and of a secondary battery using the negative electrode.

DETAILED DESCRIPTION OF THE INVENTION

Embodiments of the present invention are described as follows with reference to drawings. The present invention is not limited to the following embodiments except for the basic features described therein. The following description mainly relates to the case of using a negative electrode which includes a copper current collector and an active material layer thereon which is silicon oxide ($SiO_x$) capable of electrochemically absorbing and desorbing lithium ions. The $SiO_x$ is a compound containing silicon and oxygen, and may also contain impurities.

First Exemplary Embodiment

Figure 1:
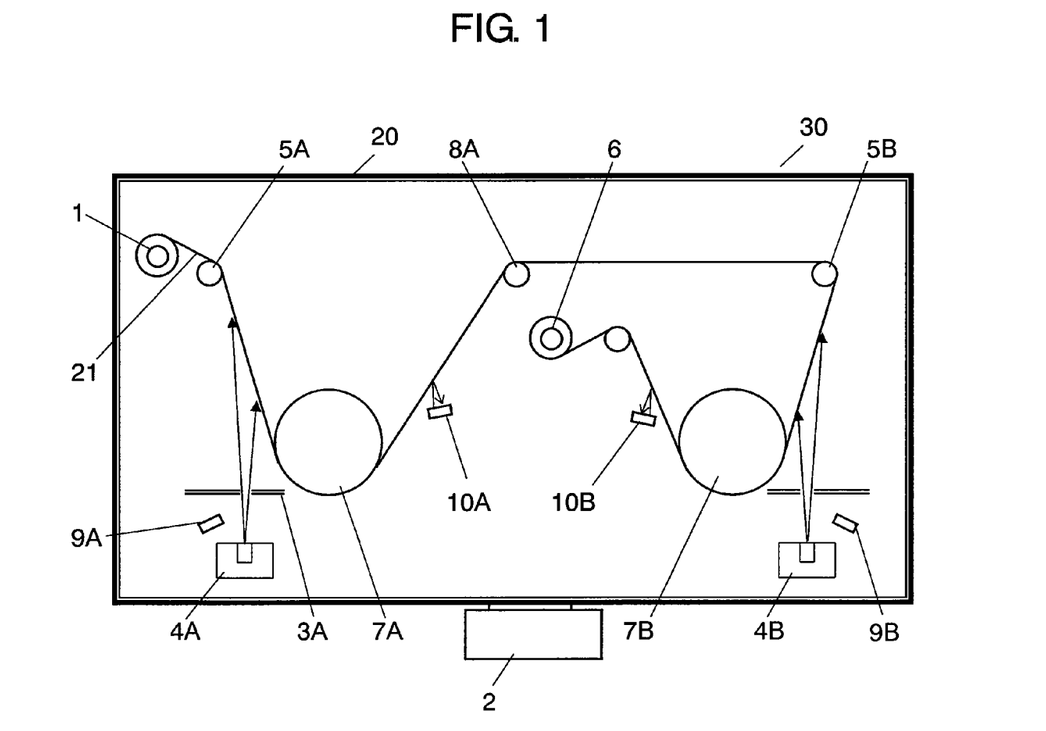
FIG. 1 is a schematic view of a device for producing a negative electrode of a secondary battery according to a first exemplary embodiment of the present invention.
Figure 2:
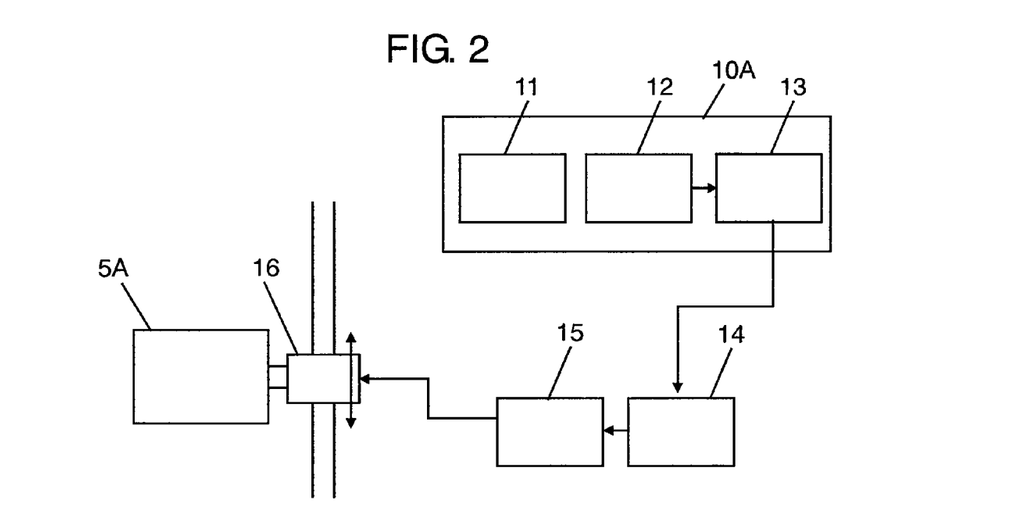
FIG. 2 is a block diagram showing details of an essential part of the production device shown in FIG. 1.
Figure 3:
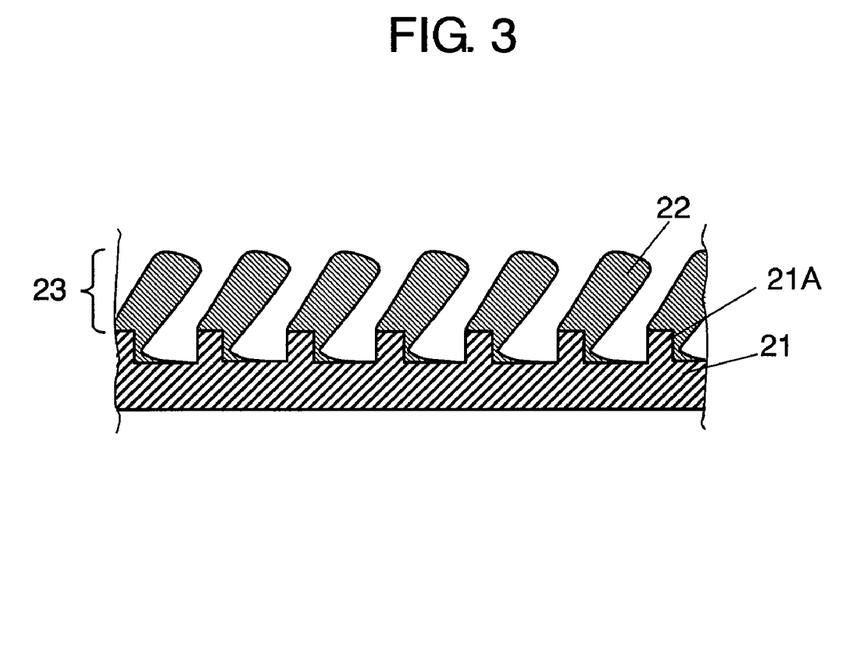
FIG. 3 is a schematic sectional view of a negative electrode produced by the production device shown in FIG. 1.
Figure 4:
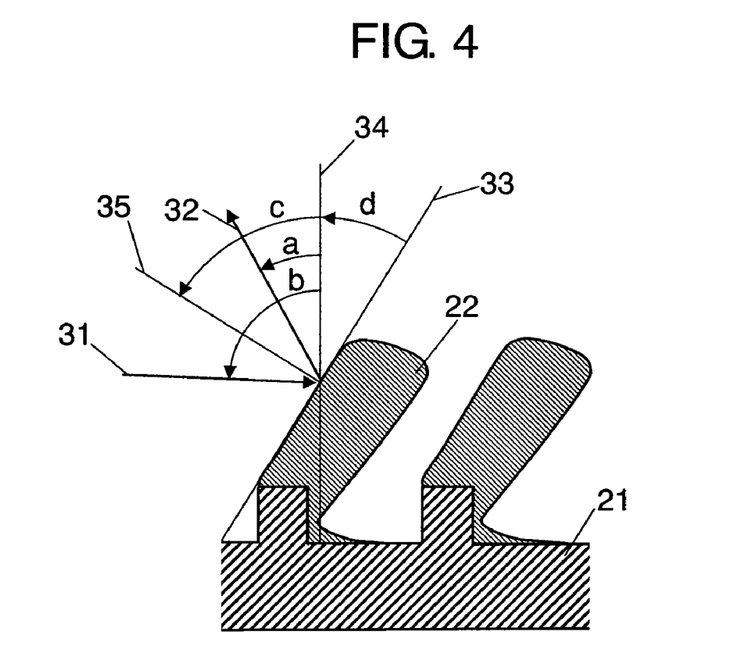
FIG. 4 shows how to estimate the angle of growth of first columnar bodies with respect to a normal line parallel to the thickness direction of the current collector shown in FIG. 3.

FIG. 1 is a schematic view of a device for producing a negative electrode of a secondary battery according to a first exemplary embodiment of the present invention. FIG. 2 is a block diagram showing details of an essential part thereof. FIG. 3 is a schematic sectional view of a negative electrode produced by the production device shown in FIG. 1. For simplification, FIG. 3 shows only one side of the negative electrode. In reality, in the negative electrode, current collector 21 has projections 21A on both sides thereof, but FIG. 3 shows only one side thereof. FIG. 4 shows how to estimate the angle of growth of first columnar bodies with respect to a normal line parallel to the thickness direction of the current collector shown in FIG. 3.

In production device 30 of FIG. 1, current collector 21 is transferred from feed roll 1 to wind-up roll 6 via film-forming rolls 7A and 7B. These rolls are housed with evaporation units 4A and 4B in vacuum chamber 20. Vacuum chamber 20 is depressurized by vacuum pump 2. Evaporation units 4A and 4B each include an evaporation source, a crucible, and an electron beam generator as one unit. Using production device 30, active material layer 23 as a negative electrode active material layer is formed on one side of current collector 21 as shown in FIG. 3 as follows.

Current collector 21 is provided on its surfaces with a large number of projections 21A. Current collector 21 can be, for example, a 30 μm thick electrolytic copper foil with a plurality of projections in its thickness direction formed by pattern electroplating. The projections are 10 μm each in height, namely in its thickness direction, in width, and in depth. Alternatively, current collector 21 can be a roughened copper foil such as a roughened electrolytic copper foil.

Vacuum chamber 20 is in an inert atmosphere which is almost a vacuum. It is, for example, in an argon atmosphere under a pressure of $10^{-3}$ Pa. For vapor deposition, in evaporation units 4A and 4B, the electron beam generated by the electron beam generator is polarized by a polarization yoke and irradiated to the evaporation source. The evaporation source can be, for example, scrap silicon (purity: 99.999%) produced during the fabrication of semiconductor wafers. Evaporation unit 4A thus generates Si vapor, which is prevented from being vertically applied to the surface of current collector 21 by adjusting the shape of an opening of mask 3A and by positioning evaporation unit 4A in such a manner that the Si vapor can be applied to the surface of current collector 21 from between fulcrum roll 5A and film-forming roll 7A. Fulcrum roll 5A is the first fulcrum and film-forming roll 7A is the second fulcrum. In addition, mask 3A is opened and closed to provide current collector 21 with a portion where active material layer 23 is not formed and current collector 21 is exposed.

While the Si vapor is thus applied to the surface of current collector 21, current collector 21 is transferred from feed roll 1 to wind-up roll 6. In this process, oxygen of high purity (for example, 99.7%) is introduced into vacuum chamber 20 through nozzle 9A and reacted with the Si vapor generated by evaporation unit 4A. As a result, first columnar bodies 22 of $SiO_x$ are grown from projections 21A on current collector 21, thereby forming active material layer 23.

Thus, evaporation unit 4A, nozzle 9A, fulcrum roll 5A, and film-forming roll 7A together make up a first forming part. The first forming part forms active material layer 23 including first columnar bodies 22 of $SiO_x$ by using silicon in an oxygen-containing atmosphere by a gas-phase process. First columnar bodies 22 are grown obliquely from projections 21A formed on at least one side of current collector 21.

After being formed on one side of current collector 21 by film-forming roll 7A, first columnar bodies 22 can also be formed on the other side in the same manner by transferring current collector 21 to film-forming roll 7B via fulcrum roll 8A as the third fulcrum and fulcrum roll 5B as the fourth fulcrum.

The following is a description of how to control the direction of growth of first columnar bodies 22 within a predetermined range. The following mainly describes active material layer 23 formed on one side of current collector 21. As shown in FIG. 1, first measurement part 10A irradiates light to current collector 21 having active material layer 23 including first columnar bodies 22 and then receives the reflected light. More specifically, as shown in FIG. 2, first measurement part 10A includes irradiation part 11, light receiving part 12, and operation part 13 which together make up a device for testing a negative electrode of a secondary battery. Irradiation part 11 irradiates light to active material layer 23. Light receiving part 12 receives the reflected light from active material layer 23. Operation part 13 calculates the angle between the reflected light and a normal line parallel to the thickness direction of current collector 21.

Production device 30 also includes first calculation part 14, controller 15, and position adjustment part 16. First calculation part 14 estimates the angle of growth of first columnar bodies 22 with respect to the normal line parallel to the thickness direction of current collector 21 based on the angle calculated by operation part 13 of first measurement part 10A. Controller 15 feedbacks the angle of growth thus estimated to the first forming part. More specifically, controller 15 controls position adjustment part 16 to move fulcrum roll 5A. This changes the angle of current collector 21 with respect to the moving direction of the Si vapor. In other words, controller 15 changes the angle between the moving direction of the Si vapor and current collector 21, thereby adjusting the angle of growth of first columnar bodies 22 within a predetermined range.

Figure 5:
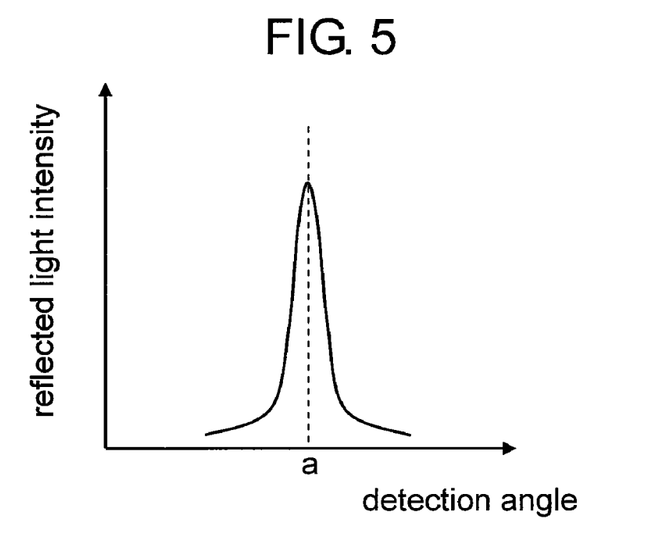
FIG. 5 is a conceptual graph showing the relationship between the angle and intensity of reflected light detected by a first measurement part of the production device shown in FIG. 1.

The following is a description of how to calculate the angle by operation part 13 and how to estimate the angle of growth of first columnar bodies 22 by first calculation part 14 with reference to FIGS. 4 and 5. FIG. 5 is a conceptual graph showing the relationship between the angle and intensity of reflected light detected by first measurement part 10A of the production device for producing a negative electrode of a secondary battery according to the first exemplary embodiment of the present invention.

Irradiation part 11 emits incident light 31 which reflects on the surfaces of first columnar bodies 22 and becomes reflected light 32. Straight line 33 represents the surface of first columnar bodies 22. Straight line 35 represents a normal line to straight line 33. Straight line 34 represents a normal line with respect to current collector 21, and is parallel to the thickness direction of current collector 21.

As shown in FIG. 5, reflected light 32 has its highest intensity when the detection angle is the angle "a". The detection angle is measured with reference to straight line 34. The angle "b" represents the angle of incident light 31 with reference to straight line 34. The angle "c" represents the angle of straight line 35 with reference to straight line 34. The angle "d" represents the angle of growth of first columnar bodies 22 with reference to straight line 34. Thus, operation part 13 calculates the angle "a" between straight line 34 and reflected light 32 based on the position at which reflected light 32 received by light receiving part 12 has its highest intensity.

The angle "c" is acquired by formula (1) as below, and the angle "d" is acquired by formula (2) as below:

$$c = (a+b)/2 \quad (1)$$

$$d = 90 - c \quad (2)$$

In this manner, first calculation part 14 calculates the angle "d" from formulas (1) and (2) using the angle "a" obtained by operation part 13 and the predetermined angle "b". In other words, first calculation part 14 estimates the angle of growth of first columnar bodies 22 with respect to straight line 34.

Controller 15 can control the angle of growth of first columnar bodies 22 by using the angle "a" obtained by operation part 13, instead of using the angle of growth of first columnar bodies 22 which has been estimated by first calculation part 14.

In the structure of FIG. 2, controller 15 changes the angle between the moving direction of the Si vapor and current collector 21 by moving fulcrum roll 5A. The angle, however, can be changed by other methods such as by moving film-forming roll 7A or by moving both fulcrum roll 5A and film-forming roll 7A either in a vertical or a horizontal direction. In the case of moving film-forming roll 7A, however, the angle to set first measurement part 10A should be changed accordingly. When moving film-forming roll 7A, the angle of first measurement part 10A with respect to current collector 21 is changed. In this manner, the angle between the moving direction of the Si vapor and current collector 21 can be changed by changing the angle of current collector 21 with respect to evaporation unit 4A, with evaporation unit 4A as the source of the Si vapor in a fixed state.

Alternatively, the angle between the moving direction of the Si vapor and current collector 21 can be also changed by changing the moving direction of the Si vapor. The moving direction of the Si vapor can be changed, for example, by moving evaporation unit 4A or mask 3A in the lateral direction in FIG. 1. Either method can adjust the angle of growth of first columnar bodies 22 with respect to straight line 34 within a predetermined range.

When active material layer 23 is formed by a reactive gas-phase process using Si vapor and oxygen which is a gas reacting with the Si vapor, the angle of growth of first columnar bodies 22 changes in accordance with the composition formed by the reaction. More specifically, the angle of growth of first columnar bodies 22 changes in accordance with the value of x in $SiO_x$. In order to control the composition, it is possible to provide a flow controller for changing the oxygen flow rate, thereby accurately determining the angle of growth as well as the composition.

The former approach to changing the angle of current collector 21 with respect to evaporation unit 4A can be mainly used for an initial adjustment at the beginning of the process of forming active material layer 23. On the other hand, the latter approach to changing the oxygen flow rate can be used for resetting the requirements during the process of forming active material layer 23.

As described hereinbefore, production device 30 includes first measurement part 10A and first calculation part 14. First measurement part 10A includes irradiation part 11, light receiving part 12, and operation part 13. Irradiation part 11 irradiates incident light 31 to active material layer 23 formed on current collector 21 having projections 21A at least on one side thereof. Active material layer 23 includes first columnar bodies 22 of the active material grown obliquely from projections 21A. Light receiving part 12 receives reflected light 32 from active material layer 23. Operation part 13 calculates the angle between reflected light 32 and straight line 34, which is the normal line parallel to the thickness direction of current collector 21. First calculation part 14 estimates the angle of growth of first columnar bodies 22 with respect to straight line 34 based on the angle measured by first measurement part 10A. Thus, production device 30 can manage the angle of growth of first columnar bodies 22 so as to control the gaps between first columnar bodies 22.

The test device included in production device 30 determines whether or not the angle between reflected light 32 and normal line 34 is appropriate. The angle depends on the angle of growth of first columnar bodies 22. This makes it possible to choose a negative electrode including active material layer 23 having an appropriate composition. In addition, the angle of growth of first columnar bodies 22 with respect to normal line 34 can be estimated from the measured angle. This ensures stable production of a negative electrode excellent in cycle characteristics for a secondary battery, and a secondary battery having the negative electrode.

Figure 6:
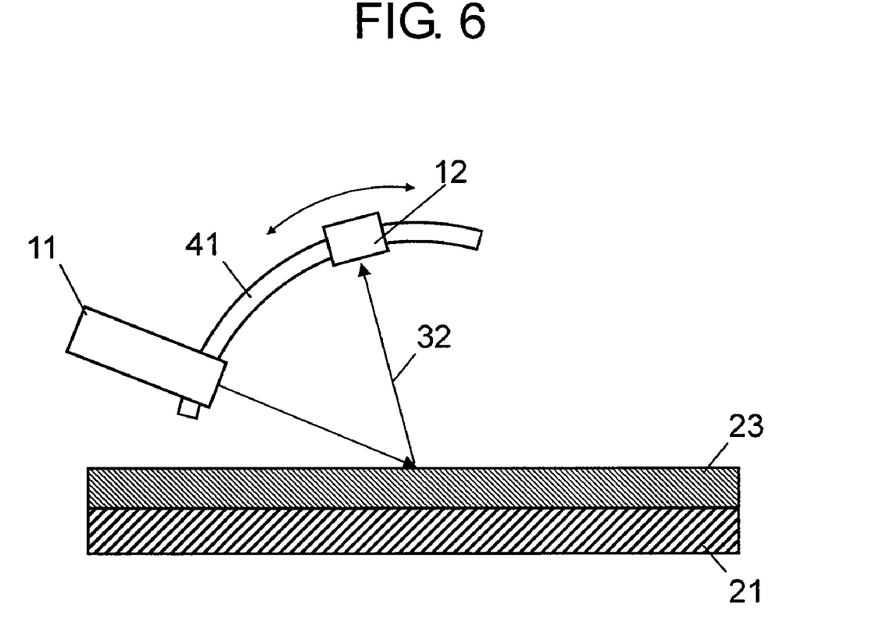
FIG. 6 is a conceptual view of a structure of a light receiving part of the production device shown in FIG. 1.

The following is a description of various structures of light receiving part 12. FIG. 6 is a conceptual view of a structure of a light receiving part of the producing device of the first exemplary embodiment of the present invention. Light receiving part 12 includes a light receiving element such as a CdS, a photodiode, and a phototransistor. Light receiving part 12 is held on the circumference of a same circle by rail 41 together with irradiation part 11, which is a light source such as a laser irradiator. Light receiving part 12 can move along rail 41. Rail 41 is set in a plane parallel to the moving direction and thickness direction of current collector 21. While moving along rail 41, light receiving part 12 transmits its position and the intensity of reflected light 32 to operation part 13. This allows operation part 13 to detect the position of light receiving part 12 at which reflected light 32 has its highest intensity. In other words, operation part 13 detects the information shown in FIG. 5. Operation part 13 calculates the angle "a" based on the information.

In this manner, in the structure of FIG. 6, the intensity of reflected light 32 is measured while changing the position to receive reflected light 32. Then the position at which the reflected light has its highest intensity is determined and the angle between reflected light 32 received at the determined position and normal line 34 is measured. This allows determining the arrival direction of reflected light 32 at its highest intensity, and hence measuring the angle between reflected light 32 in the determined arrival direction and normal line 34.

Figure 7A:
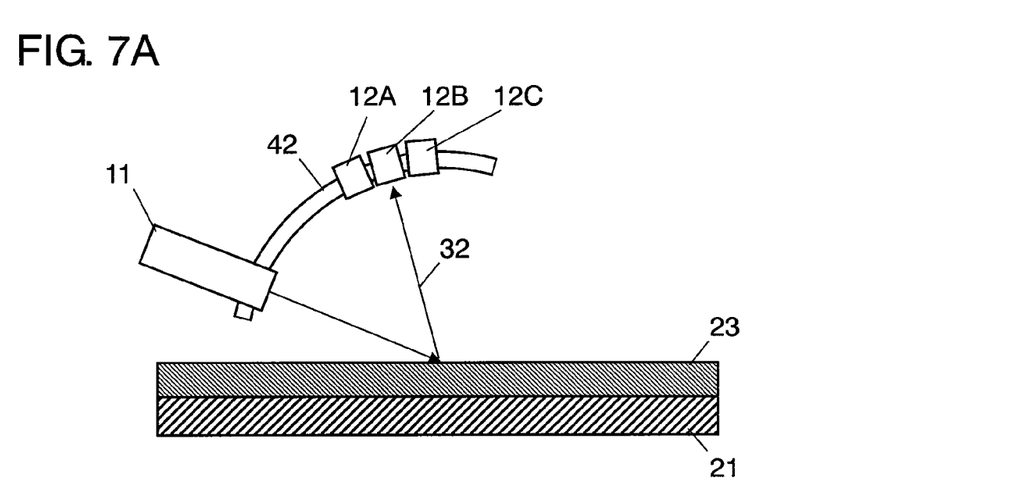
FIGS. 7A to 7C are conceptual views of other structures of the light receiving part of the production device shown in FIG. 1.
Figure 7B:
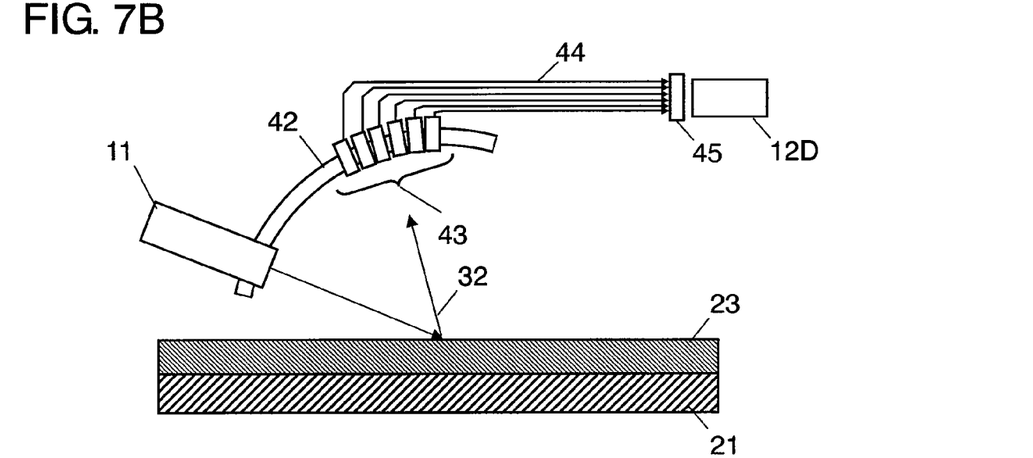
Figure 7C:
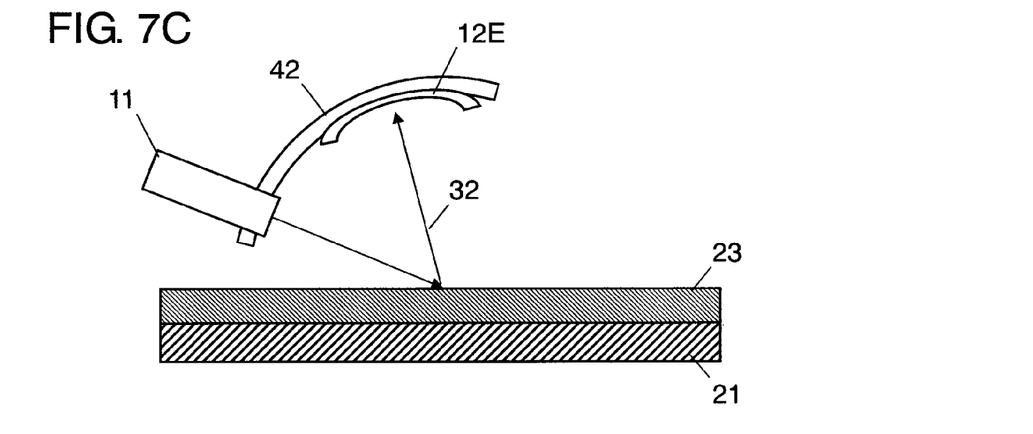

FIGS. 7A to 7C are conceptual views of other structures of the light receiving part of the producing device of the first exemplary embodiment of the present invention. In the structure of FIG. 7A, the light receiving part is formed of light receiving elements 12A, 12B, and 12C fixed to holding part 42. Operation part 13 determines which one of light receiving elements 12A, 12B, and 12C receives the reflected light with the highest intensity. Like rail 41, holding part 42 is set in a plane parallel to the moving direction and thickness direction of current collector 21. As a result, operation part 13 can calculate the angle "a" based on the position of the light receiving element that receives the reflected light with the highest intensity, of light receiving elements 12A, 12B, and 12C. Holding part 42 is arc shaped in FIG. 7A, but can be linear shaped instead.

In the structure of FIG. 7B, the light receiving part is formed of optical fibers 43 fixed to holding part 42, transmission optical fibers 44 each connected to one of optical fibers 43, optical encoder 45, and light receiving element 12D. The reflected lights received by optical fibers 43 are transmitted to light receiving element 12D via transmission optical fibers 44 and optical encoder 45. In other words, the reflected lights received by optical fibers 43 are sequentially entered to light receiving element 12D. This allows operation part 13 to detect the optical fiber that receives the reflected light with the highest intensity, of optical fibers 43 based on the switching state of optical encoder 45. Then, operation part 13 calculates the angle "a".

In the structure of FIG. 7C, the light receiving part is formed of light receiving element block 12E such as a CCD line sensor fixed to holding part 42. Light receiving element block 12E transmits the position of the reflected light to operation part 13. Operation part 13 detects the position at which the reflected light has its highest intensity based on the output of light receiving element block 12E, and then calculates the angle "a".

Thus, in the structures shown in FIGS. 7A, 7B, and 7C, the light receiving part has a plurality of positions to receive the reflected light. Operation part 13 compares the intensities of the reflected light received at these positions and determines the position at which the reflected light has its highest intensity. In other words, the intensities of reflected light 32 received at the plurality of positions are measured and the position at which the reflected light has its highest intensity is determined. Then, the angle between reflected light 32 at the determined position and normal line 34 is measured. This also allows determining the arrival direction of reflected light 32 at its highest intensity, and hence measuring the angle between reflected light 32 in the determined arrival direction and normal line 34

Figure 8:
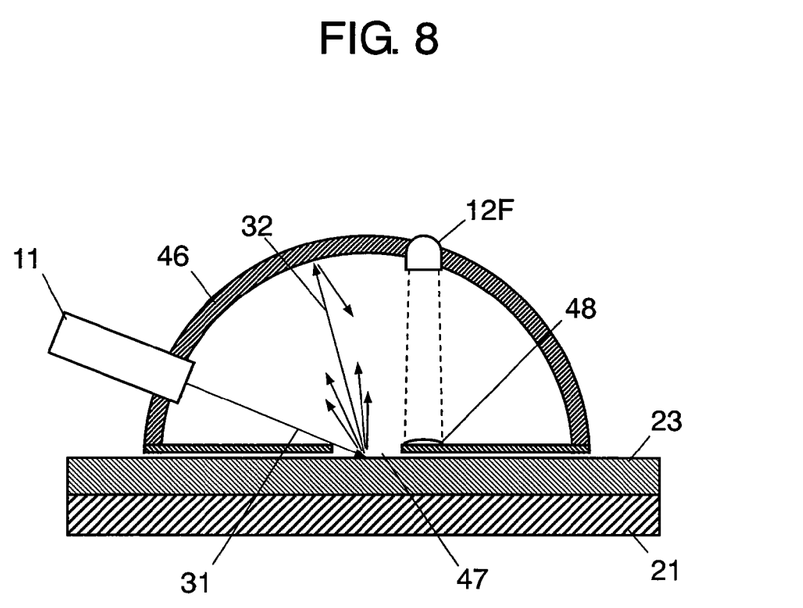
FIG. 8 is a conceptual view of another structure of the light receiving part of the production device shown in FIG. 1.

FIG. 8 is a conceptual view of further another structure of the light receiving part of the production device of the first exemplary embodiment of the present invention. In this structure, irradiation part 11 and CCD camera 12F as a light receiving part are fixed to hemispherical dome 46. Dome 46 has an inner surface formed of a screen opposed to active material layer 23, and also has opening 47 at its bottom, and mirror 48 near opening 47. Dome 46 is disposed so that its bottom is perpendicular to the thickness direction of current collector 21. CCD camera 12F shows the entire screen formed on the inner surface of dome 46 via mirror 48.

Incident light 31 from irradiation part 11 is irradiated to active material layer 23 through opening 47. Incident light 31 thus entered active material layer 23 scatters on active material layer 23 and goes toward the inner surface of dome 46. At this moment, reflected light 32 from first columnar bodies 22 has the highest light intensity. CCD camera 12F shows the entire screen formed on the inner surface of dome 46 via mirror 48. In response to the signal from CCD camera 12F, operation part 13 detects the position at which reflected light 32 has its highest intensity, thereby calculating the angle "a".

Thus, in the structure of FIG. 8, hemispherical dome 46 is provided. Dome 46 has the inner surface opposed to active material layer 23, and the distribution of reflected light 32 from active material layer 23 is detected via the inner surface of dome 46. As a result, the angle at which reflected light 32 has its highest intensity is determined, thereby measuring the angle between reflected light 32 with its highest intensity and normal line 34. This method also allows determining the arrival direction of reflected light 32 at its highest intensity, and hence measuring the angle between reflected light 32 in the determined arrival direction and normal line 34.

Alternatively, it is possible to make the inner surface of dome 46 as a mirror surface and dispose a convex screen at the focal point of the mirror surface instead of mirror 48. With this structure, CCD camera 12F can also detect the distribution of the reflected light. As described above, the inner surface of hemispherical dome 46 is opposed to active material layer 23, and CCD camera 12F as the light receiving part detects the distribution of the reflected light from active material layer 23 via the inner surface of dome 46. This structure allows operation part 13 to determine the angle at which the reflected light has its highest intensity, thereby measuring the angle between the reflected light with its highest intensity and the normal line.

Figure 9:
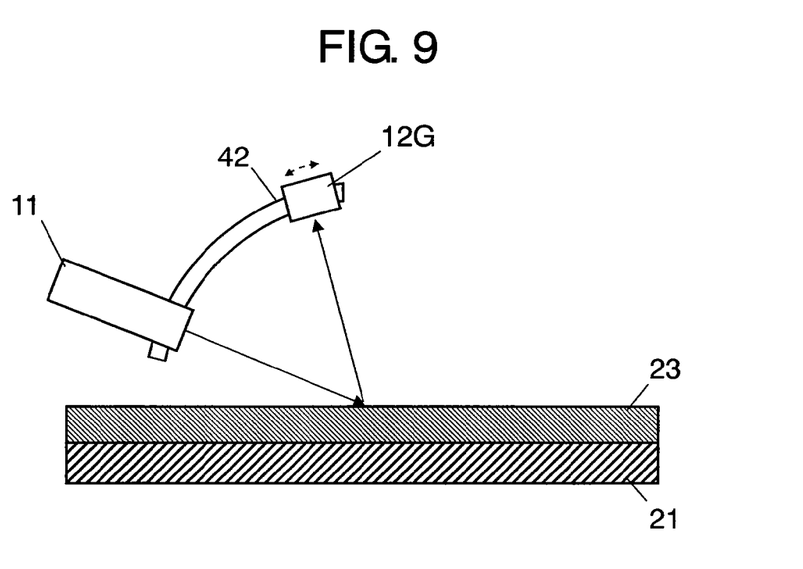
FIG. 9 is a conceptual view of another structure of the light receiving part of the production device shown in FIG. 1.

FIG. 9 is a conceptual view of still another structure of the light receiving part of the production device of the first exemplary embodiment of the present invention. In this structure, light receiving part 12G is fixed to holding part 42. Operation part 13 measures the intensity of the reflected light and estimates the deviation angle between the position at which the reflected light has its highest intensity and the position to which light receiving part 12G is fixed. This allows operation part 13 to estimate the position at which the reflected light has its highest intensity and to calculate the angle "a". Light receiving part 12G may also be in a semi-fixed state so as to move on holding part 42 little by little. This either increases or decreases the intensity of the reflected light with the movement of light receiving part 12G. As a result, it becomes possible to accurately detect on which side of light receiving part 12G the position at which the reflected light has its highest intensity is located.

In the case of using Si as the active material, oxygen can be prevented from being introduced through nozzle 9A, or nozzle 9A can be prevented from being provided in production device 30 in FIG. 1.

The negative electrode thus produced is cut in size, and as necessary, a lead is welded to the portion where current collector 21 is exposed by using mask 3A. Then, the negative electrode is wound with a positive electrode capable of absorbing and desorbing lithium ions with a separator therebetween. This results in cylindrical or prismatic non-aqueous electrolyte secondary batteries.

Figure 10:
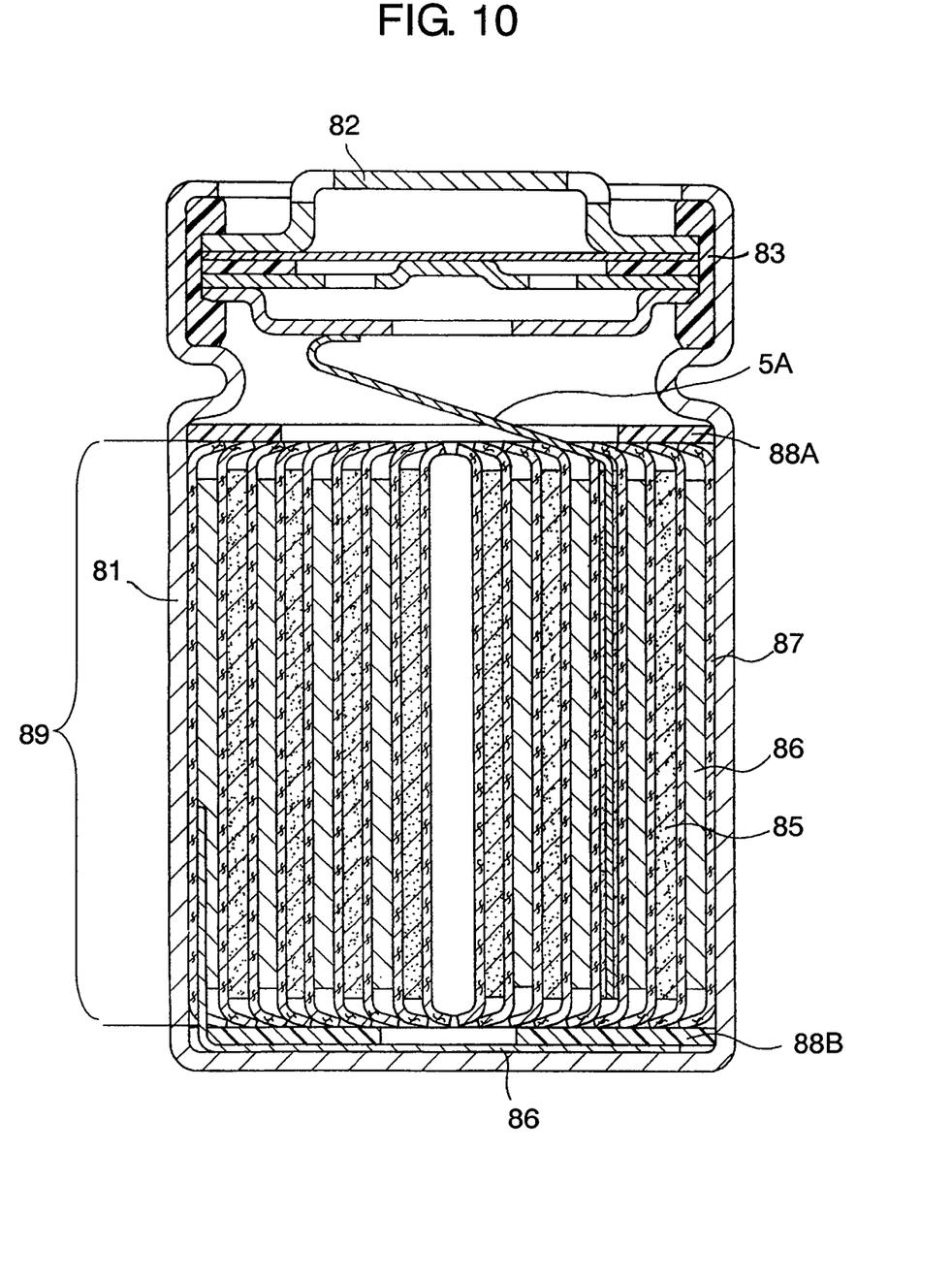
FIG. 10 is a longitudinal sectional view showing a non-aqueous electrolyte secondary battery according to the first exemplary embodiment of the present invention.

Fig. X is a longitudinal sectional view showing a non-aqueous electrolyte secondary battery in accordance with the present embodiment. Herein, a cylindrical battery is described as an example. This non-aqueous electrolyte secondary battery includes metallic case 1 and electrode group 89 contained in case 81. Case 81 is made of, for example, stainless steel or nickel-plated iron. Electrode group 89 is formed by winding positive electrode 85 and negative electrode 86 via separator 87 in a spiral shape. Upper insulating plate 88A is disposed in the upper part of electrode group 89 and lower insulating plate 88B is disposed in the lower part of electrode group 89. The open end of case 81 is sealed by caulking case 81 to sealing plate 82 via gasket 83. Furthermore, one end of lead 85A made of aluminum (Al) is attached to positive electrode 85. Another end of lead 85A is coupled to sealing plate 82 that also works as a positive terminal. One end of lead 86A made of nickel (Ni) is attached to negative electrode 86. Another end of lead 86A is coupled to case 81 that also works as a negative terminal. Electrode group 89 is impregnated with a nonaqueous electrolyte (not shown). That is to say, the nonaqueous electrolyte exists between positive electrode 85 and negative electrode 86.

Alternatively, the negative electrode in which current collector 21 has active material layer 23 on one side thereof can be punched into a predetermined size so as to be used for coin-shaped batteries. Thus, the negative electrode produced by the production device according to the present embodiment can be used for batteries of any type. The negative electrode is used for a non-aqueous electrolyte secondary battery in the description hereinbefore, but can be used for a secondary battery with aqueous electrolyte. This holds true for a second embodiment described below.

Second Exemplary Embodiment

Figure 11:
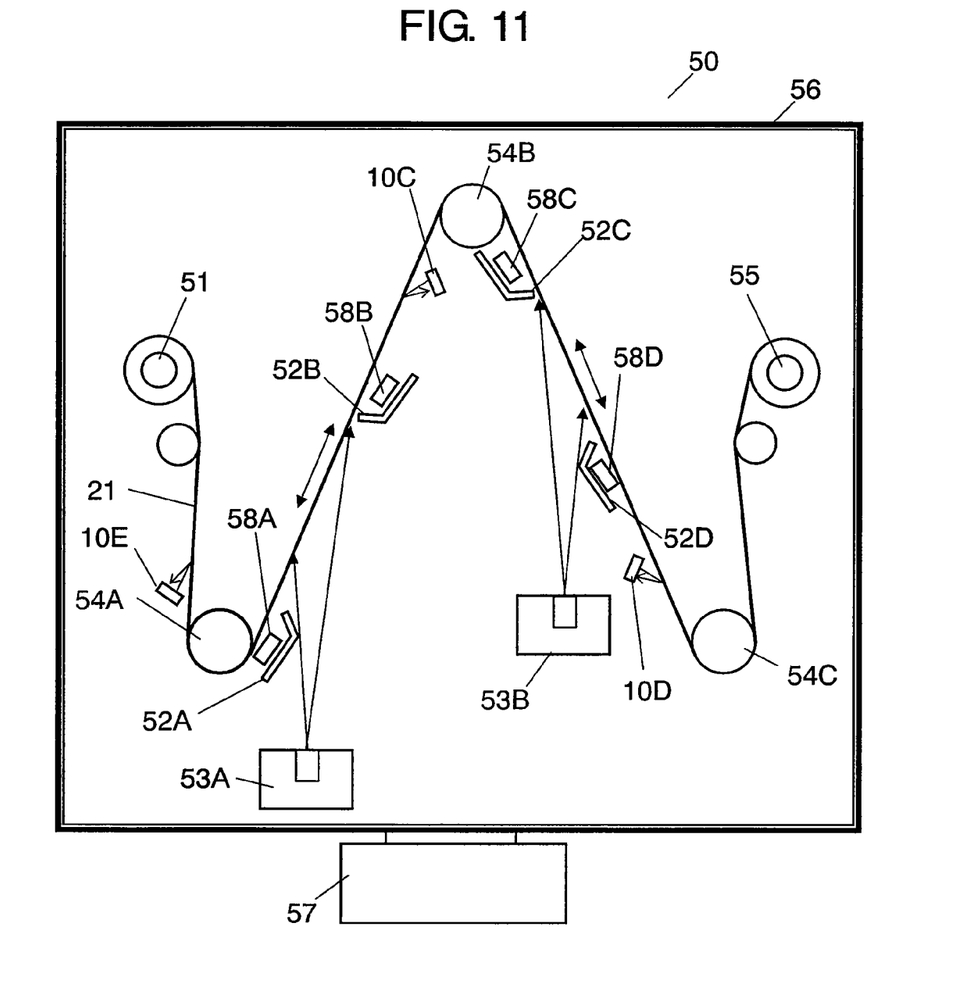
FIG. 11 is a schematic view of a device for producing a negative electrode of a secondary battery according to a second exemplary embodiment of the present invention.
Figure 12:
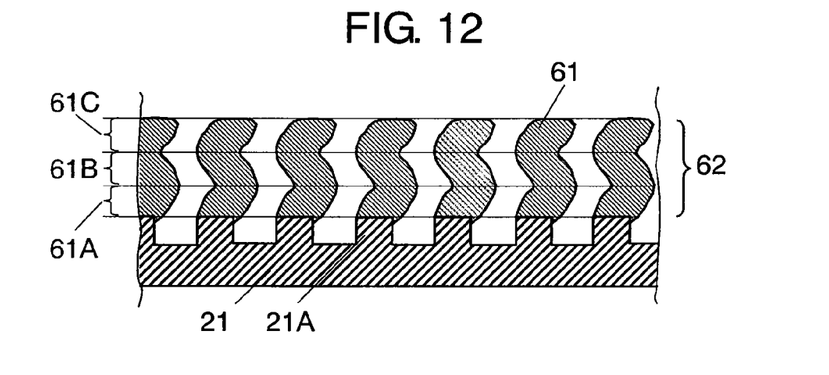
FIG. 12 is a schematic sectional view of a negative electrode produced by the production device shown in FIG. 11.

FIG. 11 is a schematic view of a device for producing a negative electrode of a secondary battery according to a second exemplary embodiment of the present invention. FIG. 12 is a schematic sectional view of a negative electrode produced by the production device shown in FIG. 11. For simplification, FIG. 12 shows only one side of the negative electrode. Current collector 21 shown in these drawings is identical to current collector 21 of the first exemplary embodiment.

In production device 50, current collector 21 is transferred from feed roll 51 to wind-up roll 55 via fulcrum rolls 54A, 54B, and 54C, which are first, second, and third fulcrums, respectively. These rolls are housed with evaporation units 53A and 53B in vacuum chamber 56. Vacuum chamber 56 is depressurized by vacuum pump 57. Evaporation units 53A and 53B each include an evaporation source, a crucible, and an electron beam generator as one unit. Using production device 50, active material layer 62 as a negative electrode active material layer is formed on one side of current collector 21 as shown in FIG. 12 as follows:

Vacuum chamber 56 is in an inert atmosphere which is almost a vacuum. It is, for example, in an argon atmosphere under a pressure of $10^{-3}$ Pa. For evaporation, in evaporation units 53A and 53B, the electron beam generated by the electron beam generator is polarized by a polarization yoke and irradiated to the evaporation source. The evaporation source can be, for example, scrap silicon.

Evaporation unit 53A is disposed in such a manner that Si vapor is obliquely applied to current collector 21 at a position between fulcrum rolls 54A and 54B. This prevents the Si vapor generated by evaporation unit 53A from being applied vertically to the surface of current collector 21. With the same manner, evaporation unit 53B is disposed in such a manner that Si vapor is obliquely applied to current collector 21 at a position between fulcrum rolls 54B and 54C.

Production device 50 includes masks 52A, 52B, 52C, and 52D which cover nozzles 58A, 58B, 58C, and 58D, respectively. First measurement part 10C is disposed on the wind-up roll 55 side with respect to the position at which the Si vapor generated by evaporation unit 53A is applied to the surface of current collector 21. Second measurement part 10D, on the other hand, is disposed on the wind-up roll 55 side with respect to the position at which the Si vapor generated by evaporation unit 53B is applied to the surface of current collector 21.

While the Si vapor is thus applied from evaporation unit 53A to the surface of current collector 21, current collector 21 is transferred from feed roll 51 to wind-up roll 55. In this process, oxygen of high purity is applied toward current collector 21 through nozzles 58A and 58B, and reacted with the Si vapor generated by evaporation unit 53A. As a result, first columnar bodies 61A of $SiO_x$ are grown from projections 21A on current collector 21.

Next, current collector 21 having first columnar bodies 61A thereon moves to the position at which the Si vapor is applied by evaporation unit 53B. In this process, oxygen of high purity is applied toward current collector 21 through nozzles 58C and 58D, and reacted with the Si vapor generated by evaporation unit 53B. As a result, second columnar bodies 61B of $SiO_x$ are grown from first columnar bodies 61A. As shown in FIG. 12, second columnar bodies 61B are grown at an oblique angle opposite to the oblique angle of first columnar bodies 61A from the position of evaporation unit 53B with respect to current collector 21.

Thus, evaporation unit 53A, nozzles 58A, 58B, and fulcrum rolls 54A, 54B together make up a first forming part. The first forming part makes first columnar bodies 61A of $SiO_x$ grown obliquely from projections 21A formed on at least one side of current collector 21. On the other hand, evaporation unit 53B, nozzles 58C, 58D, and fulcrum rolls 54B, 54C together make up a second forming part. The second forming part makes second columnar bodies 61B of $SiO_x$ grown obliquely from first columnar bodies 61A, thereby increasing the thickness of active material layer 62.

Next, feed roll 51 and wind-up roll 55 are rotated in the reverse direction. As a result, the Si vapor generated by evaporation unit 53A is reacted with the introduced oxygen so as to make third columnar bodies 61C of $SiO_x$ grown from second columnar bodies 61B. As shown in FIG. 12, third columnar bodies 61C are grown at an oblique angle opposite to the oblique angle of second columnar bodies 61B. This results in the formation of active material layer 62 formed of active material lumps 61 having a columnar structure with folding points. It is also possible to form fourth columnar bodies on third columnar bodies 61C by rotating feed roll 51 and wind-up roll 55 in the reverse direction. Thus, the number of the folding point can be freely determined.

In the case of forming active material layer 62 formed of active material lumps 61 having a columnar structure with folding points, the angle of growth of each of first, second, and third columnar bodies 61A, 61B, 61C can be managed as follows. First measurement part 10C and second and third measurement parts 10D and 10E having the same structure as first measurement part 10C are disposed on the downstream sides of the positions at which first, second, third columnar bodies 61A, 61B, and 61C are formed respectively. Then, first, second, and third measurement parts 10C, 10D, and 10E are provided with first, second, and third calculation parts (all unillustrated), respectively, which are similar to first calculation part 14 of the first embodiment and also provided with a controller similar to controller 15 of the first embodiment. In this manner, in the case of forming bent columnar active material lumps 61, the angle of growth of each of columnar bodies 61A, 61B, and 61C can be managed independently.

In this case, the controller controls the angle of growth of each of first, second, and third columnar bodies 61A, 61B, and 61C by controlling the positions of evaporation units 53A and 53B and the positions of fulcrum rolls 54A, 54B, and 54C. In the case of moving fulcrum rolls 54A, 54B, and 54C, however, the angle to set first, second, and third measurement parts 10C, 10D, and 10E should be changed accordingly. When moving fulcrum rolls 54A, 54B, and 54C, the angles of first, second, and third measurement parts 10C, 10D, and 10E with respect to current collector 21 are changed.

As described hereinbefore, production device 50 includes the first and second forming parts, first and second measurement parts 10C, 10D, the first and second calculation parts, and the controller. Each of first and second measurement parts 10C and 10D includes the irradiation part, the light receiving part, and the operation part. The first forming part forms active material layer 62 including first columnar bodies 61A of the active material which are grown obliquely from projections 21A formed on at least one side of current collector 21. The second forming part forms second columnar bodies 61B of the active material which are grown obliquely from first columnar bodies 61A so as to increase the thickness of active material layer 62. First measurement part 10C irradiates light to first columnar bodies 61A of active material layer 62 and receives reflected light from first columnar bodies 61A, thereby measuring the angle between the reflected light and a normal line parallel to the thickness direction of current collector 21. Second measurement part 10D irradiates light to second columnar bodies 61B of active material layer 62 and receives reflected light from second columnar bodies 61B, thereby measuring the angle between the reflected light and the normal line parallel to the thickness direction of current collector 21. The first calculation part estimates the angle of growth of first columnar bodies 61A with respect to the normal line based on the angle measured by first measurement part 10C. The second calculation part estimates the angle of growth of second columnar bodies 61B with respect to the normal line based on the angle measured by second measurement part 10D. The controller feedbacks the angle of growth of first columnar bodies 61A thus estimated to the first forming part so as to adjust the angle of growth of first columnar bodies 61A within a predetermined range. The controller also feedbacks the angle of growth of second columnar bodies 61B thus estimated to the second forming part so as to adjust the angle of growth of second columnar bodies 61B within a predetermined range. In this manner, in the case of forming the second columnar bodies grown obliquely from the first columnar bodies, it is possible to estimate the angle of growth of the second columnar bodies with respect to the normal line and to feedback the estimated angle to the second forming part. Therefore, in the case of forming columnar active material lumps with folding points, the angle of growth of each of built-up columnar bodies can be managed independently.

It is possible to produce a secondary battery by using the negative electrode produced by the above-described production method together with a positive electrode opposed to the negative electrode, and an electrolyte interposed between the negative and positive electrodes. Such a secondary battery using the negative electrode in which the gaps between the columnar bodies are controlled has excellent cycle characteristics and can be stably produced.

EXAMPLES

The angle of growth of first columnar bodies 22 formed on current collector 21 as shown in FIG. 3 is measured by using the test device of the first exemplary embodiment shown in FIG. 6. Then, the measured angle is compared with the angle of growth obtained by cross-sectional observation with a scanning electron microscope (SEM). The following are the comparison results. Note that current collector 21 is a roughened copper foil having an average surface roughness of 1.8 μm and a thickness of 43 μm.

Figure 13A:
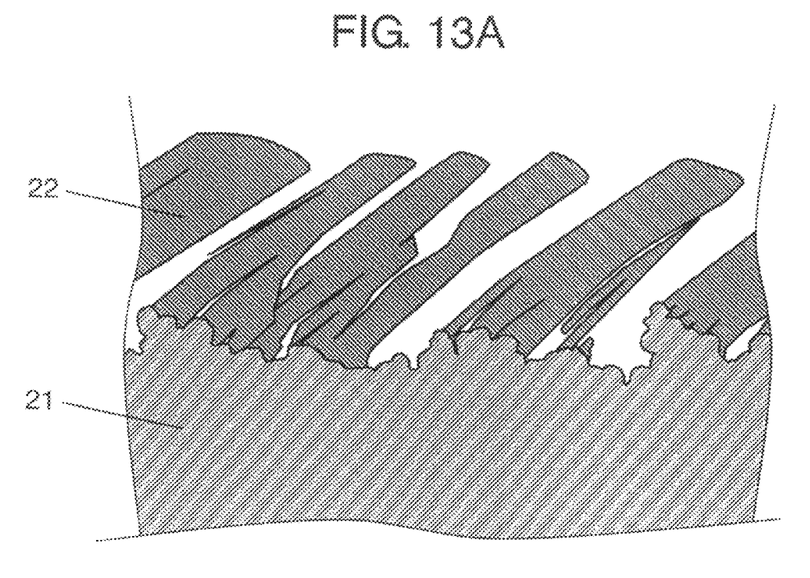
FIGS. 13A and 13B show cross-sectional SEM images of the negative electrodes produced by the production device of the first exemplary embodiment.
Figure 13B:
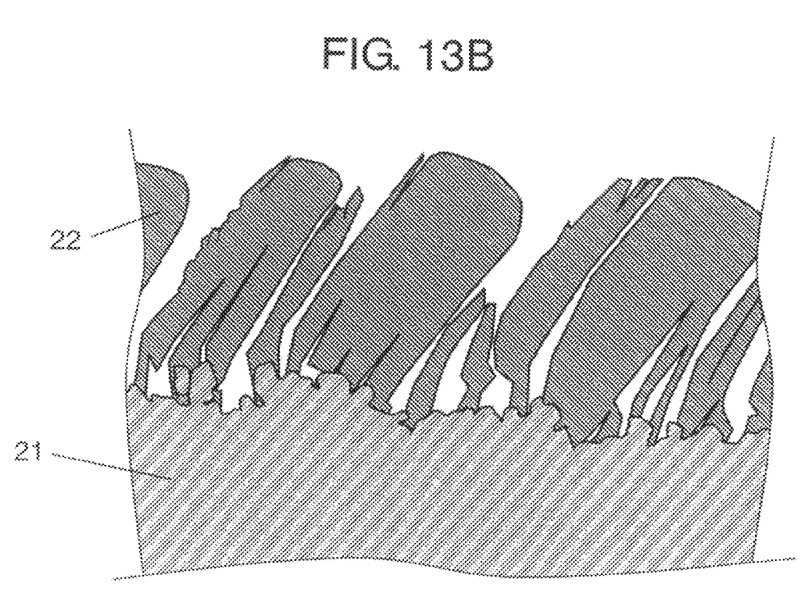

First columnar bodies 22 are formed on current collector 21 in the following conditions. First, Si (purity: 99.999%) is placed in the graphite crucible of each of evaporation units 4A and 4B. Then, current collector 21 is set to be transferred from feed roll 1 to wind-up roll 6 via film-forming rolls 7A and 7B. Vacuum chamber 20 is put in an argon atmosphere under a pressure of $10^{-3}$ Pa. While current collector 21 is being transferred, the electron beam generated by the electron beam generator is polarized by the polarization yoke and irradiated to Si, which is the evaporation source. At the same time, oxygen is introduced through nozzles 9A and 9B. The evaporation is carried out at an accelerating voltage of −8 kV and a current of 30 mA in a vacuum of $5 \times 10^{-3}$ Pa. As a result, active material layers 23 are formed on both sides of current collector 21. Then, samples A, B, C, and D of the negative electrode are produced by introducing oxygen at a flow rate of 0, 30, 60, and 80 sccm through nozzles 9A and 9B. Cross-sectional SEM images of samples A and D are shown in FIGS. 13A and 13B at 2000-fold magnification.

Figure 14A:
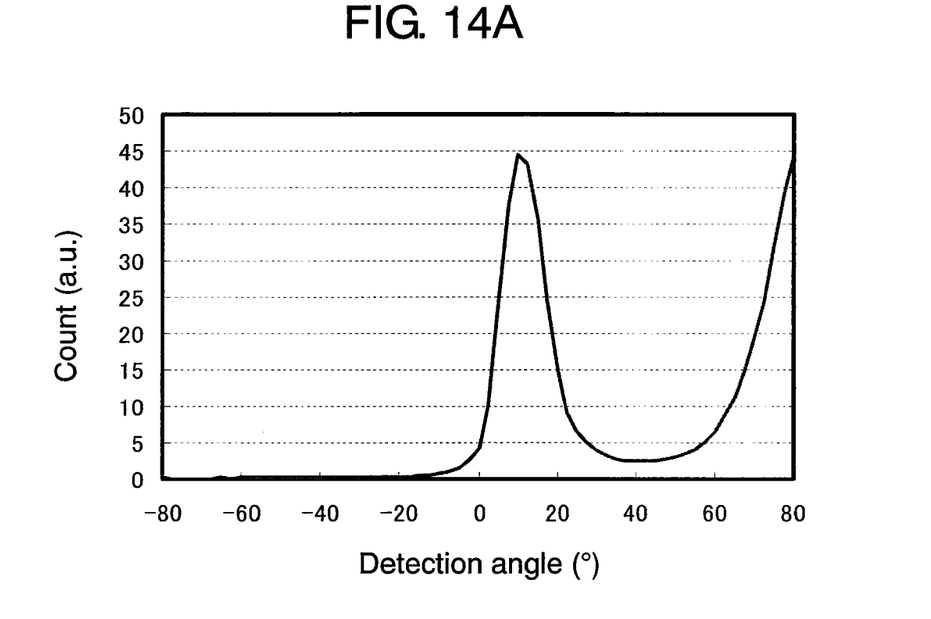
FIGS. 14A and 14B are graphs showing changes in the intensity of the reflected light with respect to the detection angle in the negative electrode shown in FIGS. 13A and 13B, the changes being detected by a device for testing a negative electrode according to the first exemplary embodiment.
Figure 14B:
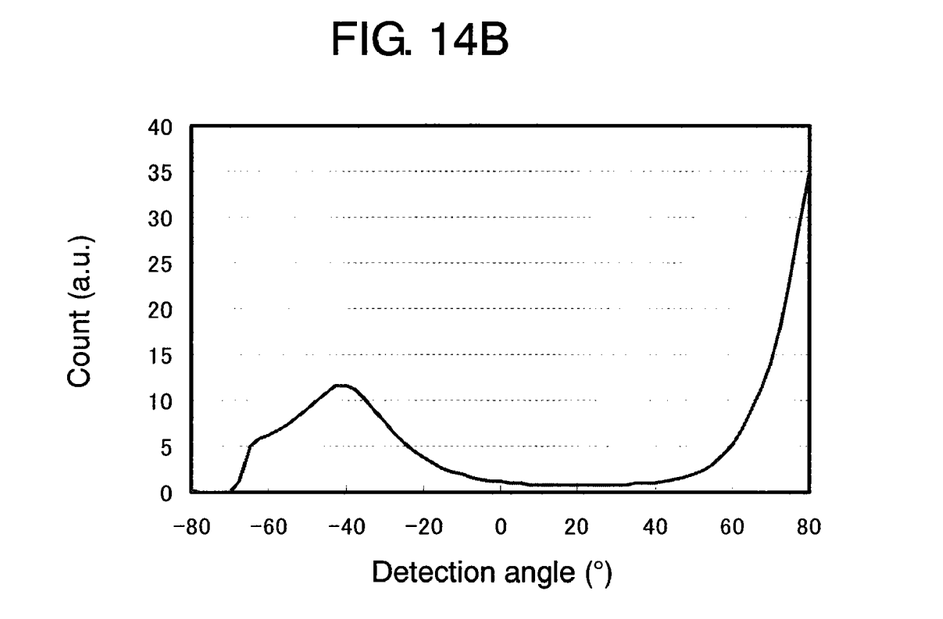

The angle of growth of first columnar bodies 22 thus produced is measured by the test device of FIG. 6. A halogen lamp is used as irradiation part 11, and a silicon photodiode is used as light receiving part 12. In FIG. 4, the angle of incidence "b" is set to −75°. Changes in the intensity of the reflected light in samples A and D with the detection angle are shown in FIGS. 14A and 14B. Samples B and C are evaluated in the same manner to acquire the angle of growth obtained by cross-sectional SEM observation and the angle of growth measured by the method of the first embodiment.

Figure 15:
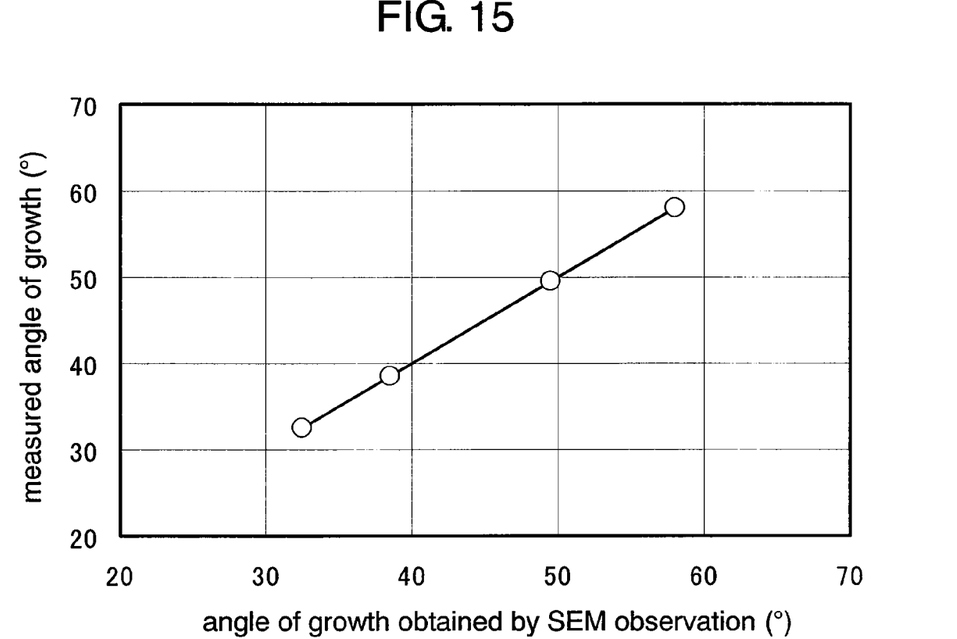
FIG. 15 shows a relationship between the angle of growth obtained by cross-sectional SEM observation and the angle of growth measured by a method for testing a negative electrode according to the first exemplary embodiment.

FIG. 15 shows the relationship between the angle of growth obtained by cross-sectional SEM observation and the angle of growth measured by the method of the first embodiment. As apparent from FIG. 15, these angles coincide well with each other. The test method of the first embodiment allows the accurate evaluation of the angle of growth of first columnar bodies 22.

Figure 16:
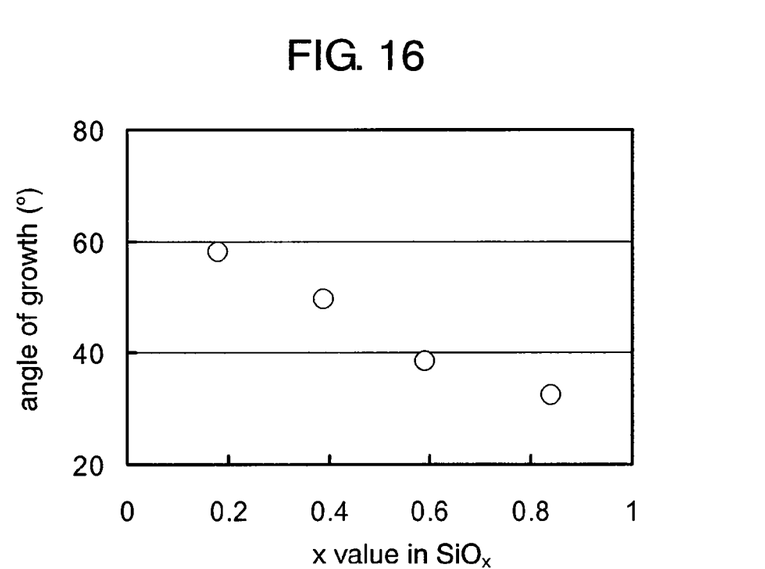
FIG. 16 shows a relationship between the angle of growth and the x value in $SiO_x$ composing the active material layer of the negative electrode produced by the production device according to the first exemplary embodiment t.

FIG. 16 shows the relationship between the angle of growth of first columnar bodies 22 and the x value in $SiO_x$ composing active material layer 23 of samples A to D. As apparent from FIG. 16, both are well correlated with each other. When the flow rate of oxygen to be introduced to form first columnar bodies 22 by a gas-phase process is changed, both the composition formed by the reaction and the angle of growth are changed. Therefore, this information can be feedbacked to control the oxygen flow rate, thereby controlling both the composition and the angle of growth.

As described hereinbefore, the method of the present invention for producing a negative electrode allows the stabilization of the angle of growth of negative electrode active material when it is grown obliquely on the current collector. This ensures stable production of batteries with excellent cycle characteristics. The non-aqueous electrolyte secondary batteries using the negative electrode produced by the production method of the present invention are useful for main power supplies for mobile communication devices, mobile electronic devices, and other similar devices.

What is claimed is:

1. A device for producing a negative electrode of a secondary battery, the device comprising:
    an irradiation part configured to irradiate light to an active material layer formed on a current collector having a plurality of projections at least on one side thereof, the active material layer including first columnar bodies of active material grown obliquely from the projections;
    a light receiving part configured to receive reflected light from the active material layer;
    an operation part configured to calculate an angle between the reflected light and a normal line parallel to a thickness direction of the current collector;
    a first forming part configured to form the active material layer on the current collector; and
    a controller configured to feedback the angle calculated by the operation part to the first forming part, thereby adjusting an angle of growth of the first columnar bodies of the active material layer within a predetermined range, wherein:
    the reflected light has a spatial distribution, and
    the light receiving part is configured to detect a highest intensity of the reflected light and a position thereof.

2. A device for producing a negative electrode of a secondary battery, the device comprising:
    a forming part configured to form an active material layer on a current collector;
    a light irradiator configured to irradiate the active material layer formed on the current collector with light;
    a light receiver configured to receive reflected light from the active material layer;
    a calculator configured to calculate an angle between the reflected light and a normal line parallel to a thickness direction of the current collector; and
    a controller configured to feedback-control a forming condition at the forming part based on the angle calculated by the calculator, wherein:
    the reflected light has a spatial distribution, and
    the angle is an angle at which the reflected light shows a highest intensity.

* * * * *